United States Patent
Zhang et al.

(10) Patent No.: US 10,203,352 B2
(45) Date of Patent: Feb. 12, 2019

(54) ANCHOR TRACKING APPARATUS FOR IN-PLANE ACCELEROMETERS AND RELATED METHODS

(71) Applicant: Analog Devices, Inc., Norwood, MA (US)

(72) Inventors: Xin Zhang, Acton, MA (US); William A. Clark, Winchester, MA (US); Michael Judy, Ipswich, MA (US)

(73) Assignee: Analog Devices, Inc., Norwood, MA (US)

( * ) Notice: Subject to any disclaimer, the term of this patent is extended or adjusted under 35 U.S.C. 154(b) by 191 days.

(21) Appl. No.: 15/228,229

(22) Filed: Aug. 4, 2016

(65) Prior Publication Data

US 2018/0038887 A1    Feb. 8, 2018

(51) Int. Cl.
  *G01P 15/125*  (2006.01)
  *G01P 15/18*   (2013.01)
  *G01P 15/08*   (2006.01)

(52) U.S. Cl.
  CPC ............ *G01P 15/125* (2013.01); *G01P 15/18* (2013.01); *B81B 2201/0235* (2013.01); *B81B 2203/0127* (2013.01); *G01P 2015/084* (2013.01)

(58) Field of Classification Search
  CPC .................................................. G01P 15/125
  See application file for complete search history.

(56) References Cited

U.S. PATENT DOCUMENTS

| 5,646,347 A | 7/1997 | Weiblen et al. |
| 5,719,336 A | 2/1998 | Ando et al. |
| 5,939,633 A | 8/1999 | Judy |
| 6,149,190 A * | 11/2000 | Galvin ............ B81C 1/00619 280/735 |
| 6,230,563 B1 | 5/2001 | Clark et al. |
| 6,841,992 B2 | 1/2005 | Yue et al. |

(Continued)

FOREIGN PATENT DOCUMENTS

| CN | 102375075 A | 3/2012 |
| CN | 103852598 A | 6/2014 |

(Continued)

OTHER PUBLICATIONS

International Search Report and Written Opinion dated Dec. 10, 2014 for Application No. PCT/US2014/057582.

(Continued)

*Primary Examiner* — Francis C Gray

(74) *Attorney, Agent, or Firm* — Wolf, Greenfield & Sacks, P.C.

(57) ABSTRACT

A microelectromechanical systems (MEMS) accelerometer is described. The MEMS accelerometer may comprise a proof mass configured to sense accelerations in a direction parallel the plane of the proof mass, and a plurality of compensation structures. The proof mass may be connected to one or more anchors through springs. The compensation structures may be coupled to the substrate of the MEMS accelerometer through a rigid connection to respective anchors. A compensation structure may comprise at least one compensation electrode forming one or more lateral compensation capacitors. The compensation capacitor(s) may be configured to sense displacement of the anchor to which the compensation structures is connected.

20 Claims, 9 Drawing Sheets

(56) References Cited

U.S. PATENT DOCUMENTS

| | | | |
|---|---|---|---|
| 6,892,576 B2 | 5/2005 | Samuels et al. | |
| 6,936,492 B2 | 8/2005 | McNeil et al. | |
| 7,197,928 B2 | 4/2007 | Chen et al. | |
| 7,240,552 B2 | 7/2007 | Acar et al. | |
| 7,444,869 B2 | 11/2008 | Johnson et al. | |
| 7,520,171 B2 | 4/2009 | Merassi et al. | |
| 7,610,809 B2 | 11/2009 | McNeil et al. | |
| 8,056,415 B2 | 11/2011 | McNeil et al. | |
| 8,146,425 B2 | 4/2012 | Zhang et al. | |
| 8,215,177 B2 | 7/2012 | Hayner et al. | |
| 8,321,170 B2 | 11/2012 | Schultz et al. | |
| 8,443,667 B2 | 5/2013 | Trusov et al. | |
| 8,453,504 B1 | 6/2013 | Mao | |
| 8,555,720 B2 | 10/2013 | Schultz | |
| 8,689,632 B2 | 4/2014 | Jia et al. | |
| 8,839,670 B2 | 9/2014 | Qiu et al. | |
| 8,960,002 B2 | 2/2015 | Nasiri et al. | |
| 8,978,475 B2 | 3/2015 | Acar | |
| 9,010,184 B2 | 4/2015 | Zou et al. | |
| 9,097,524 B2 | 8/2015 | Seeger et al. | |
| 9,134,337 B2 | 9/2015 | Simoni et al. | |
| 9,176,157 B2 | 11/2015 | Simoni et al. | |
| 9,612,254 B2 | 4/2017 | Naumann | |
| 9,927,459 B2 * | 3/2018 | Clark | G01P 15/125 |
| 2004/0149035 A1 * | 8/2004 | Acar | B81B 3/0062 |
| | | | 73/504.12 |
| 2004/0154400 A1 * | 8/2004 | Johnson | G01C 19/5656 |
| | | | 73/514.01 |
| 2004/0231420 A1 | 11/2004 | Xie et al. | |
| 2005/0284222 A1 * | 12/2005 | Johnson | G01C 19/5719 |
| | | | 73/504.02 |
| 2008/0178671 A1 | 7/2008 | Miller et al. | |
| 2009/0314085 A1 * | 12/2009 | Stahl | G01P 15/125 |
| | | | 73/514.32 |
| 2010/0107763 A1 | 5/2010 | Lin et al. | |
| 2011/0023604 A1 | 2/2011 | Cazzaniga et al. | |
| 2011/0030473 A1 | 2/2011 | Acar | |
| 2011/0049648 A1 | 3/2011 | Geisberger | |
| 2012/0125104 A1 * | 5/2012 | Qiu | G01P 15/125 |
| | | | 73/514.32 |
| 2013/0068018 A1 | 3/2013 | Seeger et al. | |
| 2013/0104651 A1 | 5/2013 | Li et al. | |
| 2013/0180332 A1 | 7/2013 | Jia et al. | |
| 2013/0186171 A1 | 7/2013 | Merrill, Jr. et al. | |
| 2013/0214367 A1 | 8/2013 | van der Heide | |
| 2013/0333471 A1 | 12/2013 | Chien | |
| 2014/0298909 A1 | 10/2014 | Simoni et al. | |
| 2014/0360268 A1 | 12/2014 | Qiu et al. | |
| 2015/0122024 A1 * | 5/2015 | Clark | G01P 15/125 |
| | | | 73/514.32 |
| 2015/0192603 A1 | 7/2015 | Baldasarre et al. | |
| 2015/0268268 A1 | 9/2015 | Liu et al. | |
| 2015/0293141 A1 | 10/2015 | Wu et al. | |
| 2016/0097791 A1 | 4/2016 | Zhang | |
| 2016/0377648 A1 | 12/2016 | Zhang | |
| 2018/0038887 A1 * | 2/2018 | Zhang | G01P 15/125 |

FOREIGN PATENT DOCUMENTS

| | | |
|---|---|---|
| DE | 102013111787 A1 | 6/2014 |
| EP | 1 640 726 A1 | 3/2006 |
| JP | 4787746 B2 | 10/2011 |
| JP | 5627590 B2 | 11/2014 |
| JP | 5638598 B2 | 12/2014 |
| JP | 5714648 B2 | 5/2015 |
| JP | 6144704 B2 | 6/2017 |
| WO | WO 2012/122879 A1 | 9/2012 |

OTHER PUBLICATIONS

International Search Report and Written Opinion dated Nov. 8, 2017 in connection with International Application No. PCT/US2017/044581.

International Search Report and Written Opinion dated Jan. 26, 2016 in connection with International Application No. PCT/US2015/052597.

U.S. Appl. No. 14/073,160, filed Nov. 6, 2013, Clark et al.
U.S. Appl. No. 14/505,928, filed Oct. 3, 2014, Zhang.
U.S. Appl. No. 15/890,835, filed Feb. 7, 2018, Clark.

* cited by examiner

ANCHOR TRACKING APPARATUS FOR IN-PLANE ACCELEROMETERS AND RELATED METHODS

FIELD OF THE DISCLOSURE

The present application relates to microelectromechanical systems (MEMS) inertial sensors.

BACKGROUND

Some microelectromechanical systems (MEMS) capacitive sensors sense in-plane accelerations. Some such sensors comprise a fixed electrode and a movable electrode. The fixed electrode is anchored to a substrate while the movable electrode is connected to a proof mass. The proof mass moves in response to accelerations in the plane of the proof mass.

SUMMARY OF THE DISCLOSURE

According to one aspect of the present application, a micro-electro-mechanical system (MEMS) accelerometer is provided. The micro-electro-mechanical system (MEMS) accelerometer may comprise a plurality of anchors connected to a substrate, a proof mass connected to at least first and second anchors of the plurality of anchors via one or more respective springs, a plurality of fixed electrodes connected to the substrate, including a first fixed electrode and a second fixed electrode, one or more sense electrodes connected to the proof mass and forming one or more sense capacitors with at least one of the plurality of fixed electrodes, wherein the one or more sense capacitors are configured to sense lateral acceleration of the proof mass, and first and second compensation structures rigidly connected to the first and second anchors, respectively, the first compensation structure comprising a first compensation electrode forming a first lateral compensation capacitor with the first fixed electrode and the second compensation structure comprising a second compensation electrode forming a second lateral compensation capacitor with the second fixed electrode.

According to another aspect of the present application, a micro-electro-mechanical system (MEMS) accelerometer is provided. The micro-electro-mechanical system (MEMS) accelerometer may comprise a substrate, a first anchor, a proof mass connected to the first anchor via a spring and connected to the substrate, a plurality of fixed electrodes connected to the substrate, including a first fixed electrode, one or more sense electrodes connected to the proof mass and forming one or more sense capacitors with at least one of the plurality of fixed electrodes, wherein the one or more sense capacitors are configured to sense lateral acceleration of the proof mass, a second anchor coupled to the substrate and not coupled to the proof mass, and a compensation structure rigidly connected to the second anchor and comprising a compensation electrode forming a lateral compensation capacitor with the first fixed electrode.

According to yet another aspect of the present application, a method is provided. The method may comprise sensing lateral accelerations of a proof mass using at least one sense capacitor, the at least one sense capacitor comprising a first sense electrode connected to the proof mass and a first fixed electrode connected to a substrate, wherein the proof mass is connected to a first anchor through a first spring and to a second anchor through a second spring, and the first and second anchors are connected to the substrate, detecting a first displacement of the first anchor using a first lateral compensation capacitor, the first lateral compensation capacitor comprising a first compensation electrode rigidly connected to the first anchor and a second fixed electrode connected to the substrate, and detecting a second displacement of the second anchor using a second lateral compensation capacitor, the second lateral compensation capacitor comprising a second compensation electrode rigidly connected to the second anchor and a third fixed electrode connected to the substrate.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1:
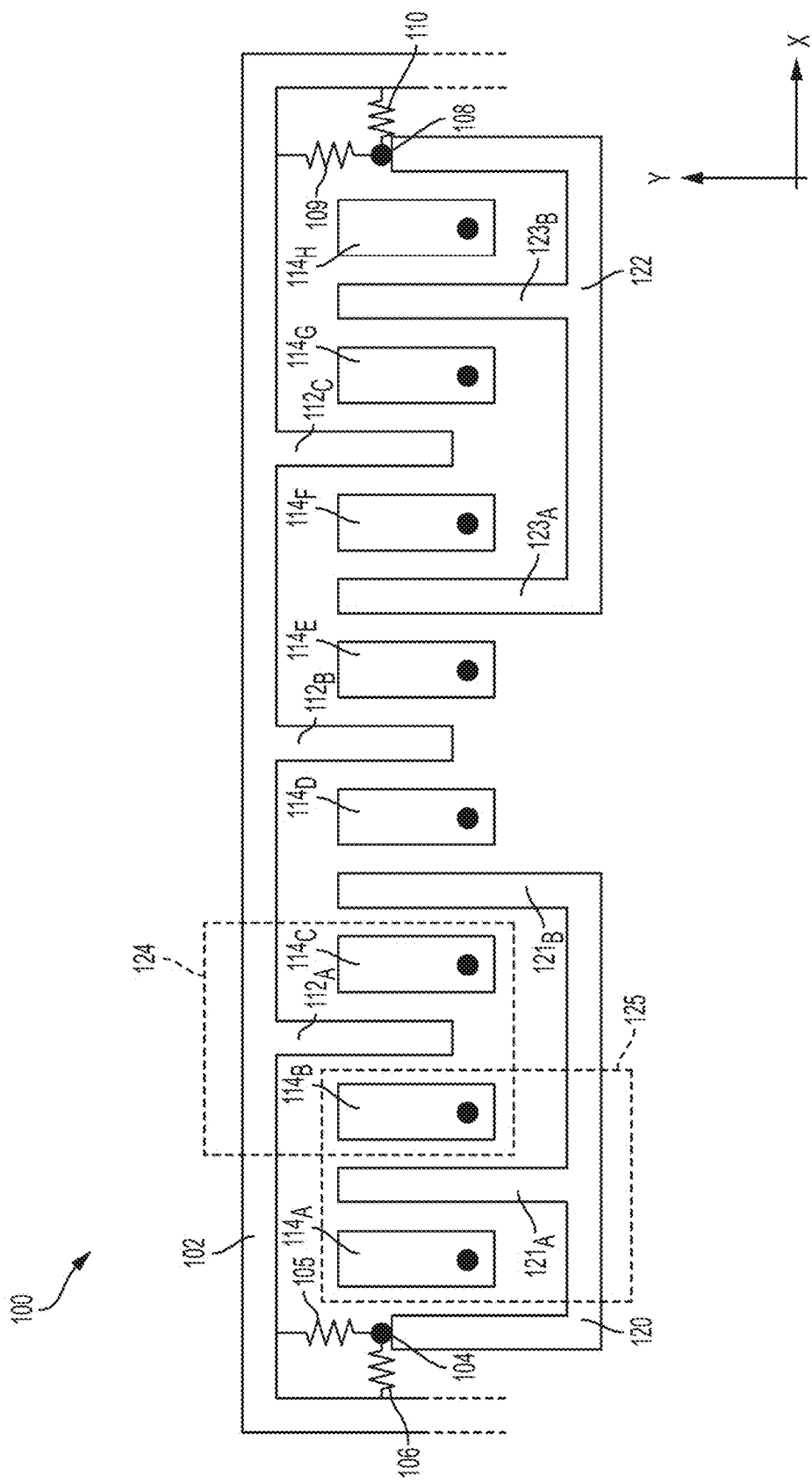
FIG. 1 illustrates schematically part of a MEMS accelerometer having a proof mass connected to anchors, and a plurality of compensation structures to detect displacement of the anchors, according to a non-limiting embodiment of the present application.

Displacement of the anchor(s) coupling the proof mass of a microelectromechanical systems (MEMS) device to a substrate of the device can negatively impact performance of the device because such displacement can generate a non-zero sensed signal which is due to the anchor displacement rather than acceleration of the proof mass. Applicant has appreciated that the accuracy of a MEMS inertial sensor, such as an accelerometer, configured to sense in-plane accelerations may be improved by detecting such displacement of the anchors separate from detecting motion of the proof mass. Further, Applicant has appreciated that when a proof mass is coupled to a substrate by multiple anchors, separately detecting displacement of such anchors provides better performance than does detecting combined displacement of the anchors. Therefore, a MEMS inertial sensor may be provided with a plurality of compensation structures configured to separately detect and compensate for the displacement of multiple anchors of the inertial sensor, such as may result from stress arising in the substrate. Reference to "in-plane acceleration" herein refers to acceleration in a direction parallel the plane of the proof mass.

Some conventional MEMS accelerometers are susceptible to stress which causes displacement of the anchor to which the proof mass is connected. One example of stress includes packaging stress, which may be caused by temperature variations. Having different thermal expansion coefficients, the substrate and the package may expand by different amounts in response to thermal variations, and as a consequence mechanical stress may arise. In some circumstances, mechanical stress may lead to warping of the substrate, thus causing the anchors to be displaced from their intended positions.

Applicant has appreciated that the stress may be location-dependent and anchors located at different portions of the substrate may be displaced by different amounts and/or along different directions. According to one aspect of the present application, a MEMS inertial sensor, such as an accelerometer, may be configured to decrease the susceptibility of its operation to stress by utilizing a plurality of compensation structures, where each compensation structure is connected to a respective anchor. In this way, the displacement of each anchor may be accurately sensed. The compensation structures may comprise beams forming at least one compensation capacitor with a fixed electrode attached to the substrate. In response to displacement of the anchor, the capacitance associated with such a compensation capacitor may vary, and therefore the displacement may be sensed. The sensed displacement of the anchor(s) may be removed from sensed motion of the proof mass, or otherwise used to compensate the acceleration sensed by the proof mass.

According to another aspect of the present application, a MEMS inertial sensor, such as an accelerometer, of the type described herein may comprise two or more compensation structures for a single sense comb. A "sense comb" refers to a set of sense capacitors formed by interdigitated beams or fingers, with the sense capacitors being configured to sense accelerations in a common direction. The sense capacitors forming a sense comb may be connected in parallel in some embodiments.

In some embodiments, a compensation structure and a proof mass may be connected to the same anchor, but in different manners. The compensation structure may be rigidly attached to the anchor while the proof mass may be springedly attached, allowing the proof mass to move relative to the anchor. In other embodiments, a compensation structure may be connected to a first anchor and the proof mass may be connected to a second anchor, different from the first anchor. The first and second anchors may be disposed in close proximity to one another. In such configurations, the two anchors may experience a similar displacement in response to stress.

According to another aspect of the present application, a MEMS accelerometer of the type described herein may be configured to sense accelerations in two directions. In some embodiments, such MEMS accelerometers may comprise one or more compensation structures configured to sense displacement of an anchor in one direction, such as the x-axis, and one or more compensation structures configured to sense displacement of another anchor in another direction, such as the y-axis.

The aspects and embodiments described above, as well as additional aspects and embodiments, are described further below. These aspects and/or embodiments may be used individually, all together, or in any combination of two or more, as the application is not limited in this respect.

FIG. 1 illustrates schematically part of a MEMS accelerometer having a proof mass connected to anchors, and a plurality of compensation structures to detect displacement of the anchors, according to a non-limiting embodiment of the present application. MEMS accelerometer 100 may comprise proof mass 102, compensation structures 120 and 122, anchors 104 and 108, springs 105, 106, 109 and 110, and fixed electrodes $114_A$, $114_B$, $114_C$, $114_D$, $114_E$, $114_F$, $114_G$, and $114_H$. MEMS accelerometer 100 may comprise additional features (not shown), such as additional fixed electrodes, compensation structures, anchors and/or springs, arranged in any suitable way. Proof mass 102 may be formed from a conductive material, such as polysilicon. Only part of the proof mass 102 is illustrated, as indicated by the dashed lines at its ends. The solid circles in FIG. 1 represent anchors.

Proof mass 102 may be connected to the substrate of MEMS accelerometer 100 through anchors 104 and 108. Proof mass 102 may be connected to anchor 104 through one or more springs, such as springs 105 and 106. In some embodiments, spring 105 may extend along the y-axis while spring 106 may extend along the x-axis. Proof mass 102 may be connected to anchor 108 through one or more springs, such as springs 109 and 110. In some embodiments, spring 109 may extend along the y-axis while spring 110 may extend along the x-axis. Proof mass 102 may be configured to move in response to accelerations in the xy-plane. Being elastic, springs 105, 106, 109 and 110 may be configured to restore proof mass 102 to its natural, or resting, position.

Figure 2A:
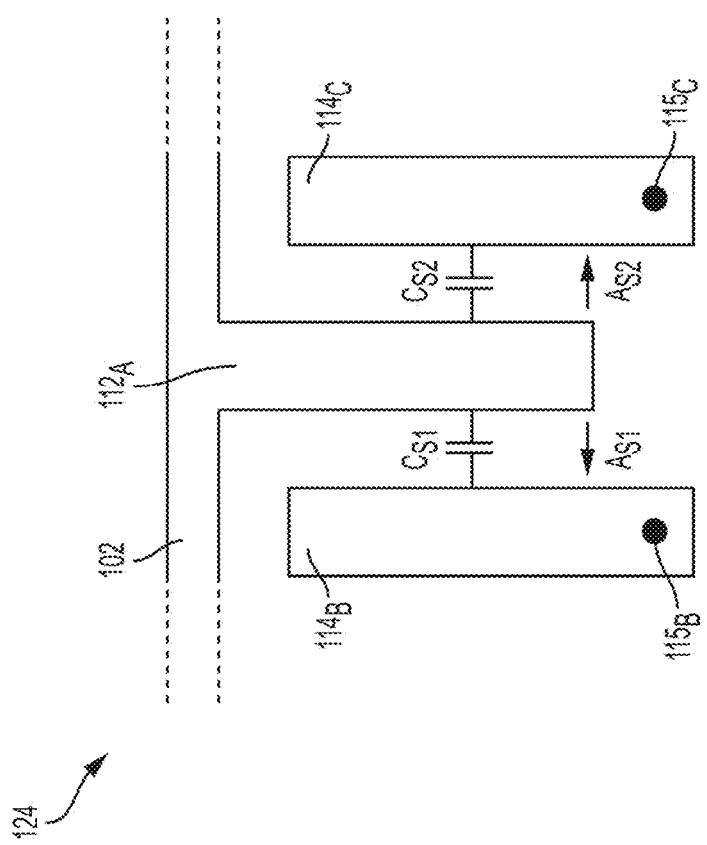
FIG. 2A illustrates a detail of FIG. 1 showing schematically part of a beam forming a pair of sense capacitors with a pair of fixed electrodes, according to a non-limiting embodiment of the present application.

Proof mass 102 may comprise one or more beams, such as beams $112_A$, $112_B$ and $112_C$. Beams $112_A$, $112_B$ and $112_C$ may also be referred to herein as "fingers" or "sense electrodes". Each beam may extend alongside at least one fixed electrode, thus forming one or more sense capacitors. For example, beam $112_A$ may extend alongside fixed electrodes $114_B$ and $114_C$. FIG. 2A illustrates a portion 124 of MEMS accelerometer 100 in additional detail. As illustrated, beam $112_A$ may form a first sense capacitor $C_{S1}$ with fixed electrode $114_B$, and a second sense capacitor $C_{S2}$ with fixed electrode $114_C$. The sense capacitors described herein may also be referred to as "lateral sense capacitors", being generally oriented in a plane parallel the xy-plane. The fixed electrodes may be formed from a conductive material, such as polysilicon. In some embodiments, fixed electrode $114_B$ may be anchored to the substrate through post $115_B$ and fixed electrode $114_C$ may be anchored to the substrate through post $115_C$. In response to accelerations in the x-axis, beam $112_A$ may move laterally according to arrows $A_{S1}$ and $A_{S2}$. When beam $112_A$ moves according to arrow $A_{S1}$, the distance between the beam and fixed electrode $114_B$ may decrease and the distance between the beam and fixed electrode $114_C$ may increase. Accordingly, the capacitance associated with sense capacitor $C_{S1}$ may increase while the capacitance associated with sense capacitor $C_{S2}$ may decrease. By contrast, when beam $112_A$ moves according to arrow $A_{S2}$, the distance between the beam and fixed electrode $114_B$ may increase and the distance between the beam and fixed electrode $114_C$ may decrease. Accordingly, the capacitance associated with sense capacitor $C_{S2}$ may increase while the capacitance associated with sense capacitor $C_{S1}$ may decrease. By sensing variations in the capacitances associated with sense capacitors $C_{S1}$ and $C_{S2}$, accelerations in a direction parallel the x-axis can be sensed. In some embodiments, variations of the capacitance associated with sense capacitor $C_{S1}$ may generate a first sense signal and variations of the capacitance associated with sense capacitor $C_{S2}$ may generate a second sense signal. In some embodiments, the first sense signal and the second sense signal may be differential. Differential signals are those having a phase shift of π or substantially π with respect to one another.

Referring back to FIG. 1, beam $112_B$ may form a first sense capacitor with fixed electrode $114_D$ and a second sense capacitor with fixed electrode $114_E$. Beam $112_C$ may form a first sense capacitor with fixed electrode $114_F$ and a second sense capacitor with fixed electrode $114_G$. In some embodiments, fixed electrodes $114_B$, $114_D$ and $114_F$ may be electrically connected to one another, for example through metal or polysilicon interconnects disposed on a surface of the substrate. In some embodiments, fixed electrodes $114_C$, $114_E$ and $114_G$ may be electrically connected to one another, for example through metal or polysilicon interconnects disposed on a surface of the substrate. As described with reference to FIG. 2A, beams $112_B$ and $112_C$ may be configured to move in response to accelerations in a direction parallel the x-axis. While FIG. 1 illustrates a proof mass having three beams, any suitable number of beams may be used.

In addition to sensing accelerations along the x-axis, the sense capacitors described herein may further sense, in some circumstances, displacement of anchor 104 and/or anchor 108 along the x-axis, which may arise in response to stress, such as package stress. Sensing displacement of one or more anchors may be detrimental, as it may distort the sense signals. For example, a variation in the capacitance associated with one of the sense electrodes may be sensed due to displacement of an anchor, even in the absence of accelerations along the x-axis. In such circumstances, a user of MEMS accelerometer 100 may be unable to distinguish accelerations of interest from anchor displacement.

According to one aspect of the present application, one or more compensation structures, such as compensation structures 120 and 122, may be used to compensate for anchor displacement. In some embodiments, compensation structure 120 may be connected to anchor 104 and compensation structure 122 may be connected to anchor 108. Each compensation structure may be configured to track displacement of the anchor to which it is connected. In contrast to the proof mass 102, the compensation structures 120 and 122 may be rigidly connected to their respective anchors 104 and 108. Being rigidly connected to the respective anchors, the compensation structures 120 and 122 may be insensitive to accelerations along the x-axis or the y-axis.

Figure 2B:
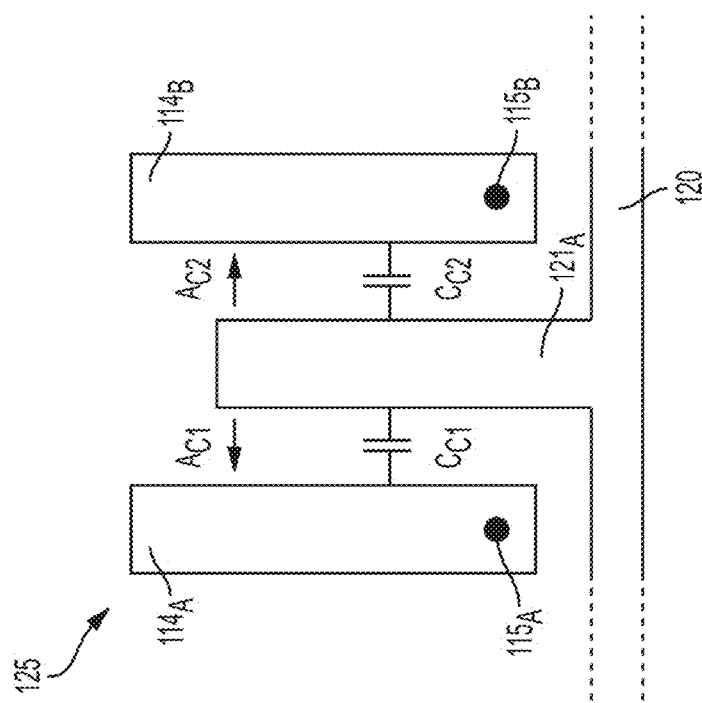
FIG. 2B illustrates an additional detail of FIG. 1 showing schematically part of a beam forming a pair of compensation capacitors with a pair of fixed electrodes, according to a non-limiting embodiment of the present application.

Compensation structure 120 may comprise one or more beams, such as beams $121_A$ and $121_B$. Compensation structure 122 may comprise one or more beams, such as beams $123_A$ and $123_B$. Beams $121_A$, $121_B$, $123_A$ and $123_B$ may also be referred to herein as "fingers" or "compensation electrodes". Each beam may extend alongside at least one fixed electrode, thus forming one or more compensation capacitors. For example, beam $121_A$ may extend alongside fixed electrodes $114_A$ and $114_B$. FIG. 2B illustrates a portion 125 of MEMS accelerometer 100 in additional detail. As illustrated, beam $121_A$ may form a first compensation capacitor $C_{C1}$ with fixed electrode $114_A$, and a second compensation capacitor $C_{C2}$ with fixed electrode $114_B$. The compensation capacitors described herein may also be referred to as "lateral compensation capacitors", being generally oriented in a plane parallel the xy-plane. The fixed electrodes may be formed from a conductive material, such as polysilicon. In some embodiments, fixed electrode $114_A$ may be anchored to the substrate through post $115_A$ and fixed electrode $114_B$ may be anchored to the substrate through post $115_B$. In response to displacement of anchor 104 in the x-axis, beam $121_A$ may move laterally according to arrows $A_{C1}$ and $A_{C2}$. When beam $121_A$ moves according to arrow $A_{C1}$, the distance between the beam and fixed electrode $114_A$ may decrease and the distance between the beam and fixed electrode $114_B$ may increase. Accordingly, the capacitance associated with compensation capacitor $C_{C1}$ may increase while the capacitance associated with sense capacitor $C_{C2}$ may decrease. By contrast, when beam $121_A$ moves according to arrow $A_{C2}$, the distance between the beam and fixed electrode $114_A$ may increase and the distance between the beam and fixed electrode $114_B$ may decrease. Accordingly, the capacitance associated with compensation capacitor $C_{C2}$ may increase while the capacitance associated with sense capacitor $C_{C1}$ may decrease. By sensing variations in the capacitances associated with compensation capacitors $C_{C1}$ and $C_{C2}$, displacement of anchor 104 in a direction parallel the x-axis can be sensed. In some embodiments, variations of the capacitance associated with compensation capacitor $C_{C1}$ may be generate a first compensation signal and variations of the capacitance associated with compensation capacitor $C_{C2}$ may generate by a second compensation signal. In some embodiments, the first compensation signal and the second compensation signal may be differential.

Referring back to FIG. 1, beam $121_B$ may form a first compensation capacitor with fixed electrode $114_C$ and a second compensation capacitor with fixed electrode $114_D$. Beam $123_A$ may form a first compensation capacitor with fixed electrode $114_E$ and a second sense capacitor with fixed electrode $114_F$. Beam $123_B$ may form a first compensation capacitor with fixed electrode $114_G$ and a second sense capacitor with fixed electrode $114_H$. In some embodiments, fixed electrode $114_A$ may be electrically connected to fixed electrode $114_C$, fixed electrode $114_B$ may be electrically connected to fixed electrode $114_D$, fixed electrode $114_E$ may be electrically connected to fixed electrode $114_G$, and fixed electrode $114_F$ may be electrically connected to fixed electrode $114_H$. As described with reference to FIG. 2B, beam $121_B$ may be configured to move in response to displacement of anchor 104 in a direction parallel the x-axis while beams $123_A$ and $123_B$ may be configured to move in response to displacement of anchor 108 in a direction parallel the x-axis. While FIG. 1 illustrates compensation structures each having two beams, any suitable number of beams may be used. As will be described further below, sense signals obtained through the sense capacitors may be combined with compensation signals obtained through compensation capacitors to generate compensated sense signals.

In some embodiments, at least two compensation structures may be used in combination with a single sense comb. In the non-limiting example illustrated in FIG. 1, a sense comb may be formed from the sense capacitors associated with beams $112_A$, $112_B$ and $112_C$. As illustrated, compensation structures 120 and 122 may be associated with such a sense comb.

Figure 3:
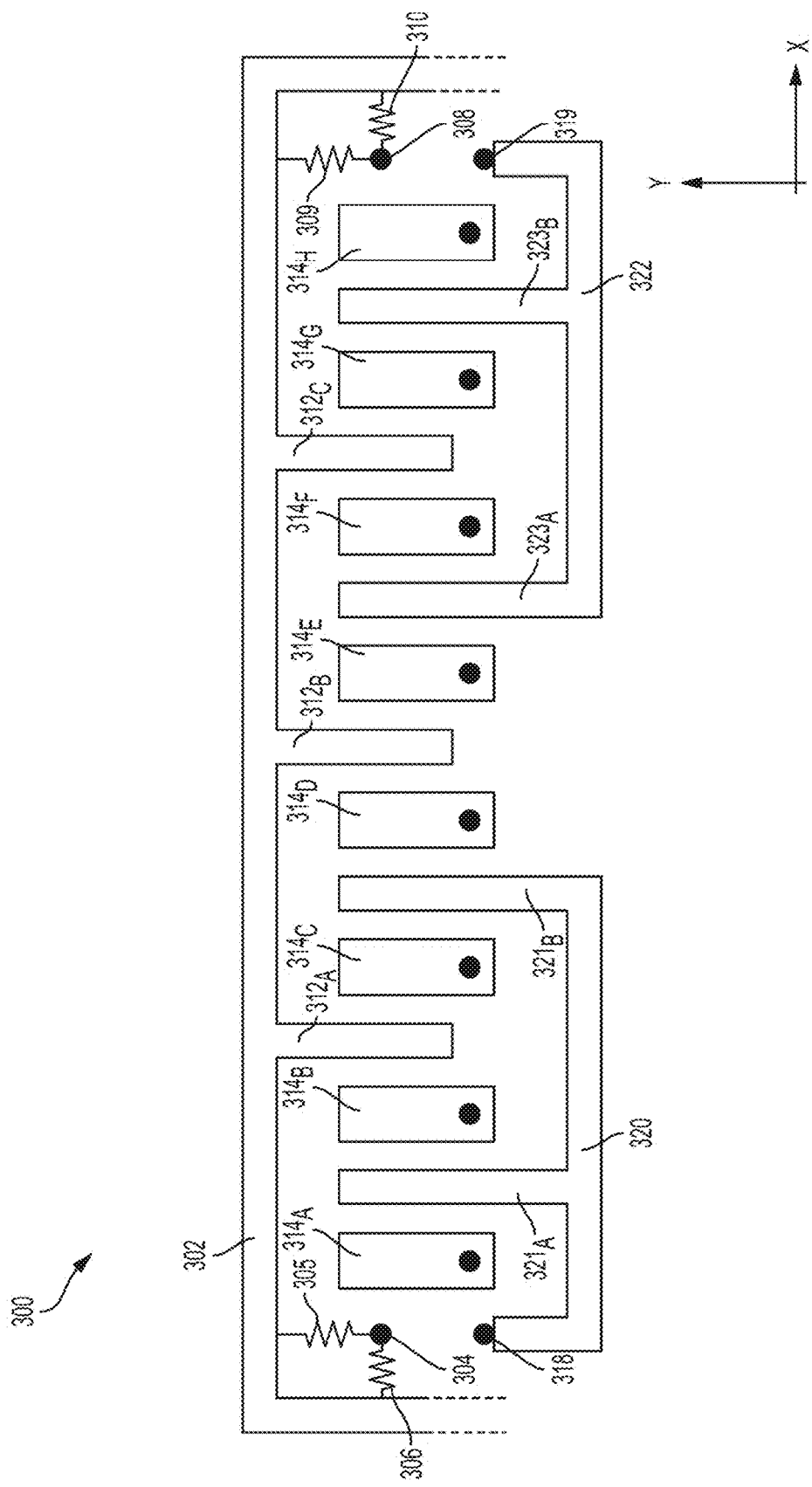
FIG. 3 illustrates schematically part of an alternative MEMS accelerometer to that of FIG. 1 having a proof mass connected to anchors and a plurality of compensation structures to detect displacement of anchors to which the compensation structures are coupled, according to a non-limiting embodiment of the present application.

In the non-limiting example illustrated in FIG. 1, the proof mass and at least one compensation structure are connected to the same anchor. For example, proof mass 102 and compensation structure 120 are coupled to the anchor 104. However, the application is not limited in this respect and the proof mass may be connected to one or more anchors, and a least one compensating structure may be connected to a separate anchor. FIG. 3 illustrates part of an alternative MEMS accelerometer comprising at least two compensation structures, according to some non-limiting embodiments. MEMS accelerometer 300 may comprise a proof mass 302, compensation structures 320 and 322, anchors 304, 308, 318 and 319, and springs 305, 306, 309 and 310. MEMS accelerometer 300 may comprise additional features (not shown), such as additional fixed electrodes, compensation structures, anchors and/or springs, arranged in any suitable way. Proof mass 302 may be formed from a conductive material, such as polysilicon.

Proof mass 302 may be connected to anchor 304 through springs 305 and 306, and may be connected to anchor 308 through springs 309 and 310. Proof mass 302 may comprise one or more beams, such as beams $312_A$, $312_B$, and $312_C$, each one of which may form one or more sense capacitors with respective fixed electrodes. For example, beam $312_A$ may form sense capacitors with fixed electrodes $314_B$ and $314_C$, beam $312_B$ may form sense capacitors with fixed electrodes $314_D$ and $314_E$, and beam $312_C$ may form sense capacitors with fixed electrodes $314_F$ and $314_G$. As described with reference to FIG. 1, the sense capacitors may be configured to sense accelerations along the x-axis. While FIG. 3 illustrates a proof mass having three beams, any suitable number of beams may be used. Beams $312_A$, $312_B$, and $312_C$ may also be referred to herein as "fingers" or "sense electrodes".

Compensation structures 320 and 322 may be connected to anchors 318 and 319 respectively. Anchor 318 may be disposed on the substrate of MEMS accelerometer 300 at a distance from anchor 304 such that the two anchors experience a similar displacement in direction and intensity. For example, the distance between anchor 304 and anchor 318 may be less than 20 µm in some embodiments, less than 15 µm in some embodiments, less than 10 µm in some embodiments, less than 5 µm in some embodiments, less than 3 µm in some embodiments, less than 2 µm in some embodiments, less than 1 µm in some embodiments, or any value within such ranges. Anchor 319 may be disposed on the substrate of MEMS accelerometer 300 at a distance from anchor 308 such that the two anchors experience a similar displacement in direction and intensity. For example, the distance between anchor 308 and anchor 319 may be any of those listed above with respect to the distance between anchor 304 and anchor 318.

Analogous to the compensation structures 120 and 122 of FIG. 1, compensation structures 320 and 322 may be configured to track displacement, along the x-axis, of anchors 318 and 319 respectively. Furthermore, being rigidly connected to the respective anchors, the compensation structures 320 and 322 may be insensitive to accelerations along the x-axis or the y-axis. Compensation structure 320 may comprise beams $321_A$ and $321_B$, and compensation structure 322 may comprise beams $323_A$ and $323_B$. Beams $321_A$, $321_B$, $323_A$, and $321_B$ may also be referred to herein as fingers or compensation electrodes. Each compensation electrode may form one or more compensation capacitors with one or more respective fixed electrodes. For example, beam $321_A$ may form compensation capacitors with fixed electrodes $314_A$ and $314_B$, beam $321_B$ may form compensation capacitors with fixed electrodes $314_C$ and $314_D$, beam $323_A$ may form compensation capacitors with fixed electrodes $314_E$ and $314_F$, beam $323_B$ may form compensation capacitors with fixed electrodes $314_G$ and $314_H$. While FIG. 3 illustrates compensation structures each having two beams, any suitable number of beams may be used. As will be described further below, sense signals obtained through the sense capacitors may be combined with compensation signals obtained through compensation capacitors to generate displacement-free sense signals.

In some embodiments, at least two compensation structures may be used in combination with a single sense comb. In the non-limiting example illustrated in FIG. 3, a sense comb may be formed from the sense capacitors associated with beams $312_A$, $312_B$ and $312_C$. As illustrated, compensation structures 320 and 322 may be associated with such a sense comb.

Figure 4:
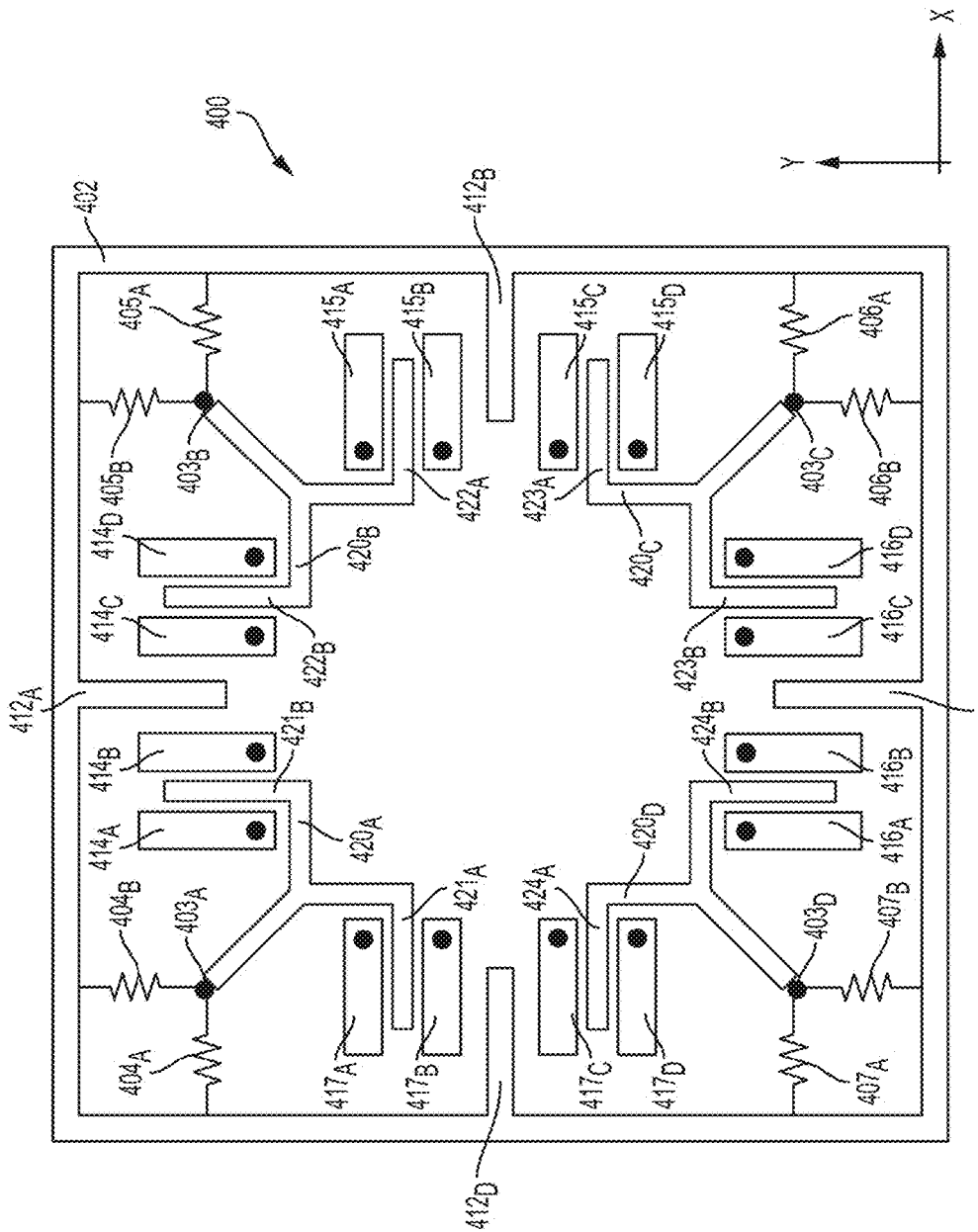
FIG. 4 illustrates schematically a MEMS accelerometer configured to sense accelerations along two different directions and including compensation structures to detect displacement of the anchors of the MEMS accelerometer, according to a non-limiting embodiment of the present application.

MEMS accelerometers 100 and 300 may be configured to sense accelerations in one direction, such along the x-axis. However, some embodiments provide MEMS accelerometers configured to sense accelerations in more than one direction. FIG. 4 illustrates schematically a MEMS accelerometer configured to sense accelerations along two different directions and including compensation structures to detect displacement of the anchors of the MEMS accelerometer, according to a non-limiting embodiment of the present application. MEMS accelerometer 400 may comprise proof mass 402, compensation structures $420_A$, $420_B$, $420_C$, and $420_D$, anchors $403_A$, $403_B$, $403_C$, and $403_D$, springs $404_A$, $404_B$, $405_A$, $405_B$, $406_A$, $406_B$, $407_A$, and $407_B$, and fixed beams $414_A$, $414_B$, $414_C$, $414_D$, $415_A$, $415_B$, $415_C$, $415_D$, $416_A$, $416_B$, $416_C$, $416_D$, $417_A$, $417_B$, $417_C$, and $417_D$.

Proof mass 402 may be connected to anchor $403_A$ through springs $404_A$ and $404_B$, may be connected to anchor $403_B$ through springs $405_A$ and $405_B$, may be connected to anchor $403_C$ through springs $406_A$ and $406_B$ and may be connected to anchor $403_D$ through springs $407_A$ and $407_B$. Proof mass 402 may be configured to move in response to accelerations in the xy-plane. Proof mass 402 may comprise beams $412_A$, $412_B$, $412_C$, and $412_D$. Each one of such beams, also referred to herein as fingers or sense electrodes, may form at least one sense capacitor with one or more respective fixed electrodes. In some embodiments, beam $412_A$ may form sense capacitors with fixed electrodes $414_B$ and $414_C$, and beam $412_C$ may form sense capacitors with fixed electrodes $416_B$ and $416_C$. The capacitances associated with beams $412_A$ and $412_C$ may be configured to vary in response to accelerations in a direction parallel the x-axis. In some embodiments, beam $412_B$ may form sense capacitors with fixed electrodes $415_B$ and $415_C$, and beam $412_D$ may form sense capacitors with fixed electrodes $417_B$ and $417_C$. The capacitances associated with beams $412_B$ and $412_D$ may be configured to vary in response to accelerations in a direction parallel the y-axis. While FIG. 4 illustrates a proof mass having four beams, any other suitable number of beams may be used, including one or more beams configured to form capacitances responding to acceleration in the x and/or y directions.

Compensation structure $420_A$ may be rigidly connected to anchor $403_A$, and may comprise one or more beams, such beams $421_A$ and $421_B$. Beam $421_A$ may form compensation capacitors with fixed electrodes $417_A$ and $417_B$. Such compensation capacitors may be configured to sense displacement of anchor $403_A$ in a direction parallel the y-axis. Beam $421_B$ may form compensation capacitors with fixed electrodes $414_A$ and $414_B$. Such compensation capacitors may be configured to sense displacement of anchor $403_A$ in a direction parallel the x-axis. Compensation structure $420_A$ is not necessarily limited to two beams. In some embodiments, a compensation structure may comprise at least two compensation electrodes for sensing anchor displacement along the x-axis and/or at least two compensation electrodes for sensing anchor displacement along the y-axis.

Compensation structure $420_B$ may be rigidly connected to anchor $403_B$, and may comprise one or more beams, such as beams $422_A$ and $422_B$. Beam $422_A$ may form compensation capacitors with fixed electrodes $415_A$ and $415_B$. Such compensation capacitors may be configured to sense displacement of anchor $403_B$ in a direction parallel the y-axis. Beam $422_B$ may form compensation capacitors with fixed electrodes $414_C$ and $414_D$. Such compensation capacitors may be configured to sense displacement of anchor $403_B$ in a direction parallel the x-axis. Compensation structure $420_B$ is not necessarily limited to two beams. In some embodiments, a compensation structure may comprise at least two compensation electrodes for sensing anchor displacement along the x-axis and/or at least two compensation electrodes for sensing anchor displacement along the y-axis.

Compensation structure $420_C$ may be rigidly connected to anchor $403_C$, and may comprise one or more beams, such beams $423_A$ and $423_B$. Beam $423_A$ may form compensation capacitors with fixed electrodes $415_C$ and $415_D$. Such compensation capacitors may be configured to sense displacement of anchor $403_C$ in a direction parallel the y-axis. Beam $423_B$ may form compensation capacitors with fixed electrodes $416_C$ and $416_D$. Such compensation capacitors may be configured to sense displacement of anchor $403_C$ in a direction parallel the x-axis. Compensation structure $420_C$ is not necessarily limited to two beams. In some embodiments, a compensation structure may comprise at least two compensation electrodes for sensing anchor displacement along the x-axis and/or at least two compensation electrodes for sensing anchor displacement along the x-axis.

Compensation structure $420_D$ may be rigidly connected to anchor $403_D$, and may comprise one or more beams, such beams $424_A$ and $424_B$. Beam $424_A$ may form compensation capacitors with fixed electrodes $417_C$ and $417_D$. Such compensation capacitors may be configured to sense displacement of anchor $403_D$ in a direction parallel the y-axis. Beam $424_B$ may form compensation capacitors with fixed electrodes $416_A$ and $416_B$. Such compensation capacitors may be configured to sense displacement of anchor $403_D$ in a direction parallel the x-axis. Compensation structure $420_D$ is not necessarily limited to two beams. In some embodiments, a compensation structure may comprise at least two compensation electrodes for sensing anchor displacement along the x-axis and/or at least two compensation electrodes for sensing anchor displacement along the y-axis.

As will be described further below, sense signals obtained through the sense capacitors may be combined with compensation signals obtained through compensation capacitors to generate compensated sense signals.

Figure 5:
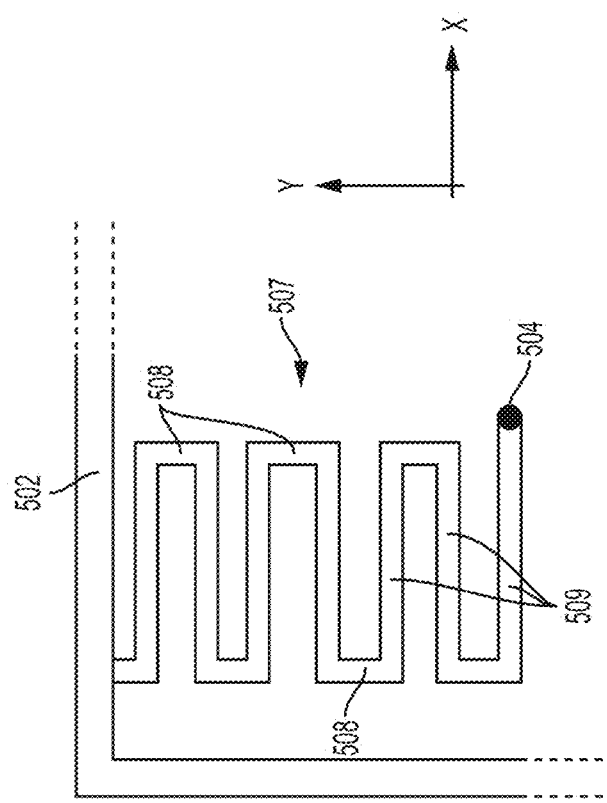
FIG. 5 illustrates schematically an exemplary spring connecting a proof mass to an anchor, according to a non-limiting embodiment of the present application.

According to one aspect of the present application, the proof mass of a MEMS accelerometer of the type described herein is connected to an anchor through one or more springs. Being elastically connected to the anchor may allow the proof mass to move freely in response to accelerations in the xy-plane. A non-limiting example of a spring for connection of the proof mass to an anchor is illustrated in FIG. 5. As illustrated, anchor 504 may be connected to proof mass 502 through spring 507. Spring 507 may comprise one or more beams 508 oriented parallel the y-axis and one or more beams 509 oriented parallel the x-axis. In some embodiments, the beams may have equal lengths. However, the application is not limited in this respect and beams having different lengths may be used. The beams may be configured to flex in response to accelerations in the x-axis and/or the y-axis, thus allowing the proof mass to move. Spring 507 may serve as any of the springs of MEMS accelerometers 100, 300 and 400. Springs comprising one or more beams oriented in a first direction and one or more beams oriented in a second direction may be referred to as "multi-segmented springs".

Figure 6:
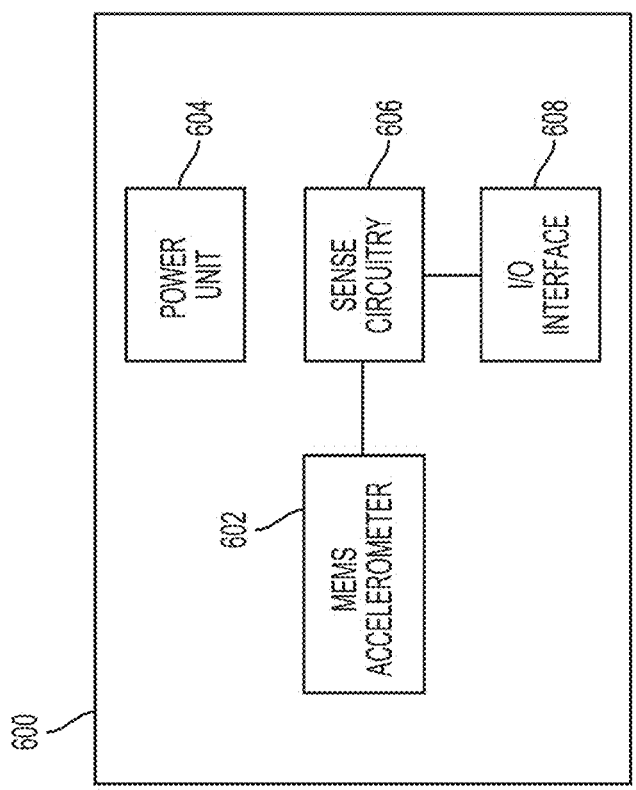
FIG. 6 is a block diagram of a system comprising a MEMS accelerometer and sense circuitry, according to a non-limiting embodiment of the present application.

As described with respect to FIGS. 1, 2 and 4, compensation signals obtained through compensation capacitors may be used to compensate for displacement of one or more anchors. In some embodiments, a MEMS inertial sensor, such as an accelerometer, of the types described herein may be connected to circuitry configured to compensate sense signals with compensation signals. FIG. 6 is a block diagram illustrating a system 600 comprising a MEMS accelerometer 602, a power unit 604, sense circuitry 606 and input/output (I/O) interface 608. MEMS accelerometer 602 may serve as MEMS accelerometer 100, 200 or 400. In some embodiments, sense circuitry 606 and MEMS accelerometer 602 may be disposed on the same substrate, such as a silicon substrate. In other embodiments, sense circuitry 606 and MEMS accelerometer 602 may be disposed on separate substrates, which may be bonded to one another and/or packaged within a common housing. In some embodiments, MEMS accelerometer 602 may further comprise an accelerometer configured to sense out-of-plane accelerations, e.g., in a direction perpendicular to the xy-plane. Such out-of-plane accelerometers may comprise one or more compensation structures configured to sense displacement of one or more anchors. In some embodiments, MEMS accelerometer 602 may further comprise one or more angular accelerometers configured to sense angular acceleration about one, two or three axes.

Sense circuitry 606 may be configured to receive sense signals obtained through one or more sense capacitors and compensation signals obtained through one or more compensation capacitors. For example, in response to accelerations in a direction parallel the x-axis, sense circuitry 606 may be configured to generate a signal $S_{S1}$ proportional to the variation $\Delta C_{S1}$ in the capacitance associated with sense capacitor $C_{S1}$, and to generate a signal $S_{s2}$ proportional to the variation $\Delta C_{s2}$ in the capacitance associated with sense capacitor $C_{s2}$. Furthermore, in response to displacement of anchor 104 in a direction parallel the x-axis, sense circuitry 606 may be configured to generate a signal $S_{C1}$ proportional to the variation $\Delta C_{C1}$ in the capacitance associated with compensation capacitor $C_{C1}$, and to generate a signal $S_{C2}$ proportional to the variation $\Delta C_{C2}$ in the capacitance associated with compensation capacitor $C_{C2}$. In some embodiments, sense circuitry 606 may be configured to generate a compensated sense signal $S_{comp}$, by combining $S_{S1}$, $S_{S2}$, $S_{C1}$ and $S_{C2}$ according to the following expression:

$$S_{comp} = S_{S1} + S_{C2} - (S_{s2} + S_{C1})$$

In some embodiments, the compensated signal may be configured to be proportional to the acceleration experienced by the MEMS accelerometer, and to be insensitive to displacement of the anchors.

In some embodiments, the sense capacitors and the compensation capacitors may be connected to provide a capacitor having a variation (a change in total capacitance), $C_T$, provided by:

$$C_T = C_{S1} + C_{C2} - (C_{S2} + C_{C1}).$$

$C_{S1}$, $C_{s2}$, $C_{C1}$ and $C_{C1}$ may be configured such that, in the absence of acceleration, $C_T=0$. When a displacement occurs under a given acceleration, the capacitances associated with $C_{S1}$ and $C_{S2}$ may vary by a same amount dC, with opposite polarities, while the capacitances associated with $C_{C1}$ and $C_{C2}$ may stay mostly unchanged due to the fact that the stiffness of the compensation structure is significantly greater than the stiffness of the sensing structure. As a consequence, the resulting displacement in the compensation structure may be significantly less that the displacement in the sensing structure. In the presence of acceleration, $C_T$ may be provided by:

$$C_T = C_{S1} + dC + C_{C2} - (C_{S2} - dC + C_{C1}) = 2dC$$

In some embodiments, $C_{S1} = C_{s2} \approx C_{C1} = C_{C2}$. In such embodiments, when an anchor displacement occurs, the capacitances associated with $C_{S1}$, $C_{s2}$, $C_{C1}$ and $C_{C2}$ may vary by a same amount $\delta C$. In such circumstance, $C_T$ is provided by:

$$C_T = C_{S1} + \delta C + C_{C2} - \delta C - (C_{S2} - \delta C + C_{C1} + \delta C) = 0$$

As a result, $C_T$ is equal to zero, in some embodiments, thus providing a compensated sense signal that does not reflect anchor displacements.

For comparison, a MEMS accelerometer not equipped with a compensation structure of the type described herein is now considered. In such circumstance, the sense capacitors may be connected to provide a capacitor having a change in capacitance $C_{TT}$ provided by:

$$C_{TT} = C_{S1} - C_{S2}$$

When a displacement occurs under a given acceleration, the capacitances associated with $C_{S1}$ and $C_{s2}$ may vary by a same amount dC, with different polarities, thus leading to:

$$C_{TT} = C_{S1} + dC - (C_{s2} - dC) = 2dC$$

In this circumstance, when an anchor displacement occurs under a given stress or die deformation, the capacitances associated with $C_{S1}$ and $C_{s2}$ may vary by a same amount $\delta C$, thus leading to:

$$C_{TT} = C_{S1} + \delta C - (C_{S2} - \delta C) = 2\delta C$$

Being sensitive to acceleration as well as anchor displacement, offset errors may arise.

System 600 may periodically transmit, via wired connections or wirelessly, a compensated sense signal to an external monitoring system, such as a computer, a smartphone, a tablet, a smartwatch, smartglasses, or any other suitable receiving device. I/O interface 608 may be configured to transmit and/or receive data via Wi-Fi, Bluetooth, Bluetooth Low Energy (BLE), Zigbee, Thread, ANT, ANT+, IEEE 802.15.4, IEEE 802.11.ah, or any other suitable wireless communication protocol. Alternatively, or additionally, I/O interface 608 may be configured to transmit and/or receive data using proprietary connectivity protocols. I/O interface 608 may comprise one or more antennas, such as a microstrip antenna. In some embodiments, I/O interface 608 may be connected to a cable, and may be configured to transmit and/or receive signals through the cable.

System 600 may be powered using power unit 604. Power unit may be configured to power sense circuitry 606, I/O interface 608, MEMS accelerometer 602, or any suitable combination thereof. In some embodiments, power unit 604 may comprise one or more batteries. System 600 may, in at least some embodiments, consume sufficiently little power to allow for its operation for extended periods based solely on battery power. The battery or batteries may be rechargeable in some embodiments. Power unit 604 may comprise one or more lithium-ion batteries, lithium polymer (LiPo) batteries, super-capacitor-based batteries, alkaline batteries, aluminum-ion batteries, mercury batteries, dry-cell batteries, zinc-carbon batteries, nickel-cadmium batteries, graphene batteries or any other suitable type of battery. In some embodiments, power unit 604 may comprise circuitry to convert AC power to DC power. For example, power unit 604 may receive AC power from a power source external to system 600, such as via I/O interface 608, and may provide DC power to some or all the components of system 600. In such instances, power unit 604 may comprise a rectifier, a voltage regulator, a DC-DC converter, or any other suitable apparatus for power conversion.

Power unit 604 may comprise energy harvesting components and/or energy storage components, in some embodiments. Energy may be harvested from the surrounding environment and stored for powering the system 600 when needed, which may include periodic, random, or continuous powering. The type of energy harvesting components implemented may be selected based on the anticipated environment of the system 600, for example based on the expected magnitude and frequency of motion the system 600 is likely to experience, the amount of stress the system is likely to experience, the amount of light exposure the system is likely to experience, and/or the temperature(s) to which the system is likely to be exposed, among other possible considerations. Examples of suitable energy harvesting technologies include thermoelectric energy harvesting, magnetic vibrational harvesting, electrical overstress harvesting, photovoltaic harvesting, radio frequency harvesting, and kinetic energy harvesting. The energy storage components may comprise supercapacitors in some embodiments.

System 600 may be deployed in various settings to detect acceleration, including sports, healthcare, military, and industrial applications, among others. Some non-limiting examples are now described. A system 600 may be a wearable sensor deployed in monitoring sports-related physical activity and performance, patient health, military personnel activity, or other applications of interest of a user.

Figure 7:
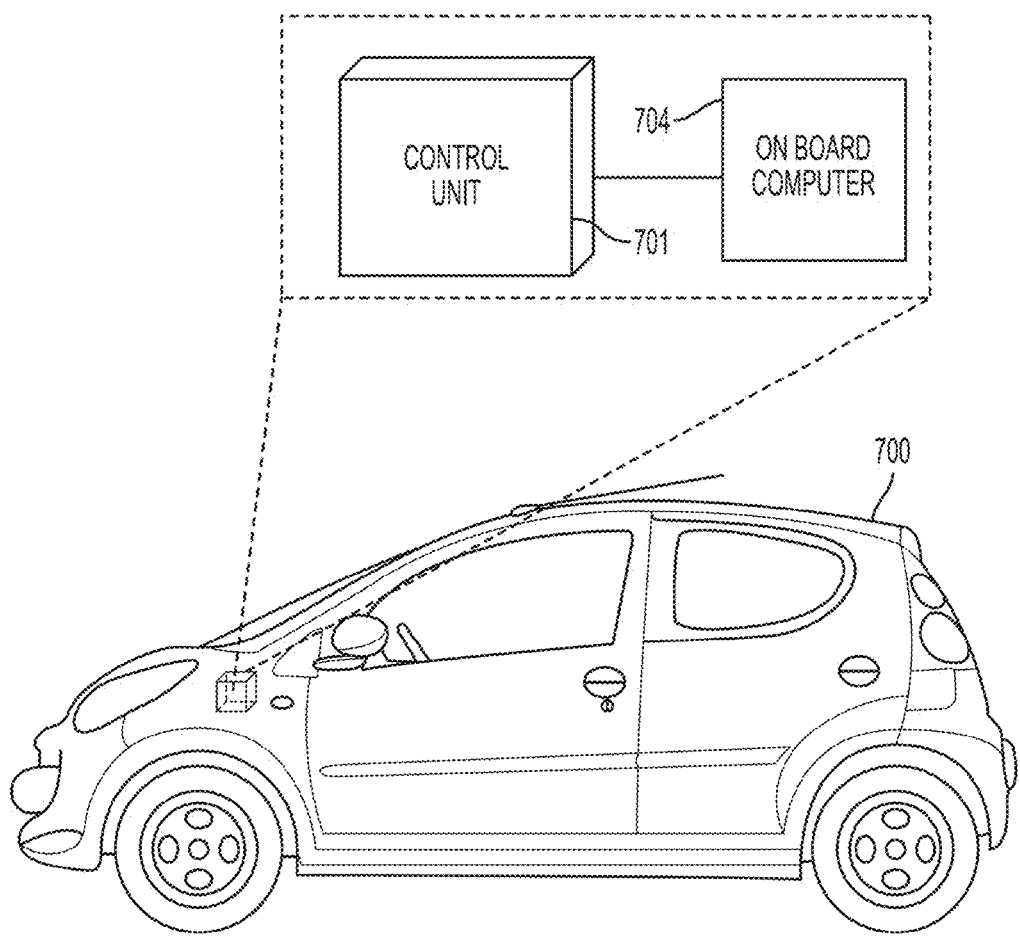
FIG. 7 illustrates an automobile in which may be employed the system of FIG. 6, according to a non-limiting embodiment of the present application.

One such setting is in automobiles, or other vehicles, such as boats and aircraft. FIG. 7 illustrates an example, in which a sensor system of the types described herein is employed in a car. In the example of FIG. 7, an automobile 700 includes a control unit 701 coupled to an onboard computer 704 of the car by a wired or wireless connection. Control unit 701 may comprise system 600 of FIG. 6. System 600 may comprise a package or housing attached to a suitable part of the automobile 700, and may comprise a MEMS accelerometer of the type described herein. The MEMS accelerometer may, as an example, sense accelerations along the driving direction and/or perpendicular the driving direction. Additionally, or alternatively, the MEMS accelerometer may be configured to sense vertical accelerations, thus monitoring, for example, the status of the suspensions. Control unit 701 may receive power and control signals from the onboard computer 704, and may supply sense signals, such as compensated sense signals of the type described herein, to the onboard computer 704. In some situations, temperature variations within control unit 701 may induce stress to the MEMS accelerometer disposed therein. Operation of system 600 in the manners described with respect to FIG. 6 may mitigate, or eliminate, the impact of such stress.

Figure 8:
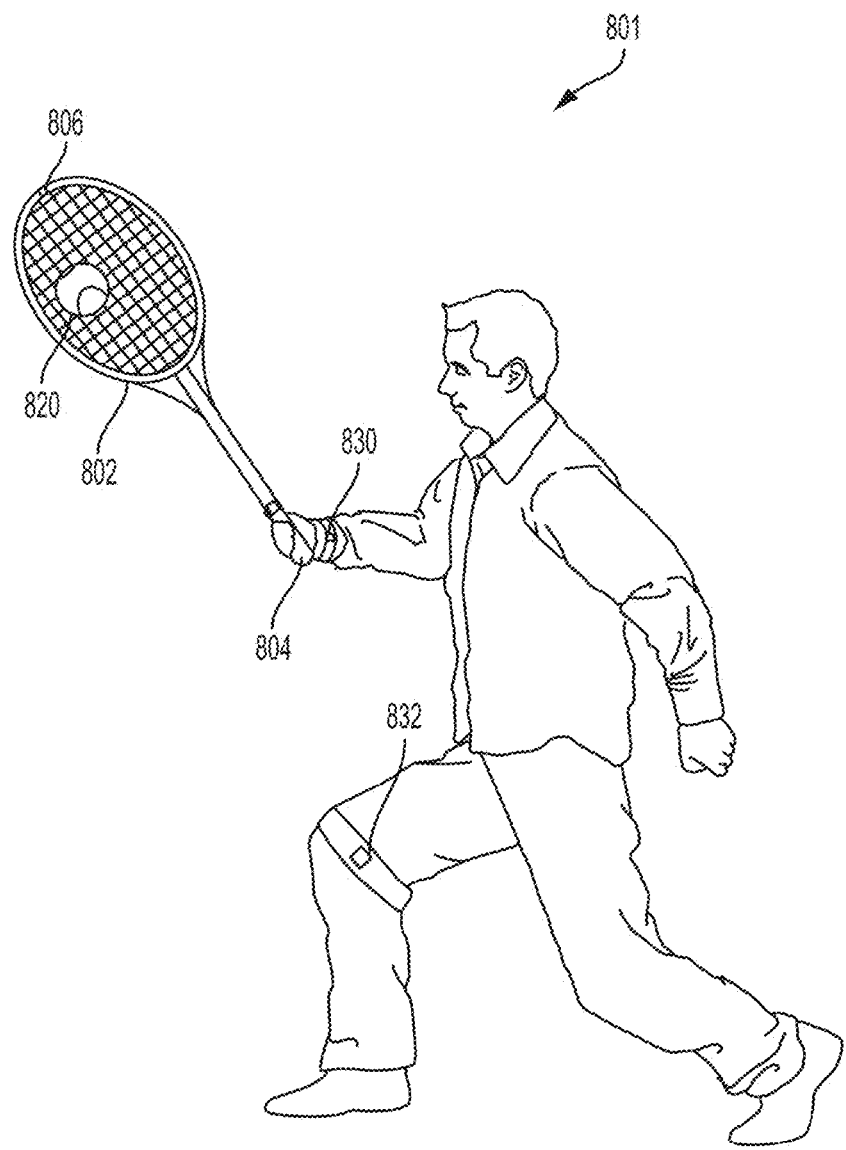
FIG. 8 illustrates a tennis player wearing a wearable device comprising the system of FIG. 6, according to a non-limiting embodiment of the present application.

Another setting is in wearable devices for sports applications, such as tennis. FIG. 8 illustrates a tennis player 801 holding a racket 802, and wearing a wrist band 830 and a leg band 832. Racket 802 may comprise one or more devices attached thereon, such as devices 804 and 806. Such devices may each comprise a system 600, and may be configured to detect angular accelerations and/or linear accelerations. For example, device 804, mounted on the grip of racket 802, may be configured to sense accelerations associated with the racket's handle. Device 806, mounted on the racket's head, may be configured to sense accelerations associated with the any suitable part of the racket's head, such as the racket's tip. The devices 804 and 806 may be embedded within the racket frame or body in some embodiments. In some embodiments, data associated with accelerations experienced by racket 802 may provide an indication of the player's ability to play tennis. For example, information regarding a forehand motion, or a backhand motion, may be obtained. Player 801 may wear one or more wearable devices, such as a wrist band 830 and/or a leg band 832. Such wearable devices may each be equipped with a system 600, and may be configured to sense angular and/or linear accelerations. For example, a system 600, positioned on a wrist band, may be configured to provide information on the motion of the player's arm, while a system 600 positioned on a leg band, may be configured to provide information on the motion of the player's leg.

While compensating structures are described with respect to accelerometers, the application is not limited in this respect. Compensating structures of the types described herein may be used to sense displacement of one or more anchors in connection with gyroscopes, resonators, switches, or any other suitable MEMS device.

Aspects of the present application may provide one or more benefits, some of which have been previously described. Now described are some non-limiting examples of such benefits. It should be appreciated that not all aspects and embodiments necessarily provide all of the benefits now described. Further, it should be appreciated that aspects of the present application may provide additional benefits to those now described.

Aspects of the present application provide MEMS accelerometers having reduced sensitivity to stress, such as package stress. In some circumstances, stress may be non-uniform across the substrate of a MEMS accelerometer, thus causing different anchors to experience different displacement. Some embodiments provide a MEMS inertial sensor, such as an accelerometer, having a plurality of anchors, where each anchor may be connected to a compensation structure. In this way, displacement of each anchor may be sensed independently.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A micro electro-mechanical system (MEMS) accelerometer comprising:
a plurality of anchors connected to a substrate;
a proof mass connected to at least first and second anchors of the plurality of anchors via one or more respective springs;
a plurality of fixed electrodes connected to the substrate, including a first fixed electrode and a second fixed electrode;
one or more sense electrodes connected to the proof mass and forming one or more sense capacitors with at least one of the plurality of fixed electrodes, wherein the one or more sense capacitors are configured to sense lateral acceleration of the proof mass; and
first and second compensation structures rigidly connected to the first and second anchors, respectively, the first compensation structure comprising a first compensation electrode forming a first lateral compensation capacitor with the first fixed electrode and the second compensation structure comprising a second compensation electrode forming a second lateral compensation capacitor with the second fixed electrode.

2. The MEMS accelerometer of claim 1, further comprising a third compensation structure rigidly connected to the first anchor and comprising a third compensation electrode forming a third lateral compensation capacitor with a third fixed electrode of the plurality of fixed electrodes, wherein the first lateral compensation capacitor is responsive to displacement of the first anchor in a first lateral direction and the third lateral compensation capacitor is responsive to displacement of the first anchor in a second lateral direction different than the first lateral direction.

3. The MEMS accelerometer of claim 2, wherein the first lateral direction and the second lateral direction are orthogonal.

4. The MEMS accelerometer of claim 1, wherein each of the first and second fixed electrodes is connected to the substrate through one or more posts.

5. The MEMS accelerometer of claim 1, wherein the one or more sense electrodes comprise a first sense electrode and a second sense electrode, and wherein the first sense electrode forms a first sense capacitor with the first fixed electrode and the second sense electrode forms a second sense capacitor with the second fixed electrode.

6. The MEMS accelerometer of claim 1, wherein the one or more sense capacitors is a first sense capacitor, and the one or more sense electrodes forms a second sense capacitor with a third fixed electrode of the plurality of fixed electrodes, and wherein the first sense capacitor and the second sense capacitor are configured to generate a pair of differential signals.

7. The MEMS accelerometer of claim 1, wherein the first compensation electrode forms a third lateral compensation capacitor with a third fixed electrode of the plurality of fixed electrodes, and wherein the first and third lateral compensation capacitors are configured to generate a pair of differential signals.

8. The MEMS accelerometer of claim 1, wherein the first lateral compensation capacitor is responsive to displacement of the first anchor in a first lateral direction and the second lateral compensation capacitor is responsive to displacement of the second anchor in the first lateral direction.

9. The MEMS accelerometer of claim 1, further comprising sense circuitry, disposed within the substrate, the sense circuitry being configured to compensate a sense signal representing a variation in capacitance of the one or more sense capacitors for displacement of the first anchor by combining the sense signal with a compensation signal obtained through the first lateral compensation capacitor.

10. A micro electro-mechanical system (MEMS) accelerometer comprising:
a substrate;
a first anchor;
a proof mass connected to the first anchor via a spring and connected to the substrate;
a plurality of fixed electrodes connected to the substrate, including a first fixed electrode;
one or more sense electrodes connected to the proof mass and forming one or more sense capacitors with at least one of the plurality of fixed electrodes, wherein the one or more sense capacitors are configured to sense lateral acceleration of the proof mass;
a second anchor coupled to the substrate and not coupled to the proof mass; and a compensation structure rigidly connected to the second anchor and comprising a compensation electrode forming a lateral compensation capacitor with the first fixed electrode.

11. The MEMS accelerometer of claim 10, wherein the first anchor is electrically connected to the second anchor.

12. The MEMS accelerometer of claim 10, wherein the first anchor is positioned at a distance from the second anchor that is less than 20 µm.

13. The MEMS accelerometer of claim 10, wherein the compensation structure is a first compensation structure, the compensation electrode is a first compensation electrode and the lateral compensation capacitor is a first lateral compensation capacitor, the MEMS accelerometer further comprising:
a second compensation structure rigidly connected to the second anchor and comprising a second compensation electrode forming a second lateral compensation capacitor with a second fixed electrode of the plurality of fixed electrodes, wherein the first lateral compensation capacitor is responsive to displacement of the second anchor in a first lateral direction and the second lateral compensation capacitor is responsive to displacement of the second anchor in a second lateral direction different than the first lateral direction.

14. The MEMS accelerometer of claim 10, wherein the one or more sense capacitors is a first sense capacitor, and the one or more sense electrodes forms a second sense capacitor with a second fixed electrode of the plurality of fixed electrodes, and wherein the first sense capacitor and the second sense capacitor are configured to generate a pair of differential signals.

15. The MEMS accelerometer of claim 10, wherein the compensation capacitor is a first lateral compensation capacitor and wherein:
the compensation electrode forms a second lateral compensation capacitor with a second fixed electrode of the plurality of fixed electrodes, and wherein the first and second lateral compensation capacitors are configured to generate a pair of differential signals.

16. The MEMS accelerometer of claim 10, further comprising sense circuitry, disposed within the substrate, the sense circuitry being configured to compensate a sense signal representing a variation in capacitance of the one or more sense capacitors for displacement of the second anchor by combining the sense signal with a compensation signal obtained through the lateral compensation capacitor.

17. A method comprising:
sensing lateral accelerations of a proof mass using at least one sense capacitor, the at least one sense capacitor comprising a first sense electrode connected to the proof mass and a first fixed electrode connected to a substrate, wherein the proof mass is connected to a first anchor through a first spring and to a second anchor through a second spring, and the first and second anchors are connected to the substrate;
detecting a first displacement of the first anchor using a first lateral compensation capacitor, the first lateral compensation capacitor comprising a first compensation electrode rigidly connected to the first anchor and a second fixed electrode connected to the substrate; and
detecting a second displacement of the second anchor using a second lateral compensation capacitor, the second lateral compensation capacitor comprising a second compensation electrode rigidly connected to the second anchor and a third fixed electrode connected to the substrate.

18. The method of claim 17, wherein the first compensation electrode is not connected to the second anchor and the second compensation electrode is not connected to the first anchor.

19. The method of claim 17, wherein the first displacement of the first anchor is along a first lateral direction, the method further comprising:
detecting a third displacement of the first anchor along a second lateral direction different from the first lateral direction using a third lateral compensation capacitor, the third lateral compensation capacitor comprising a third compensation electrode rigidly connected to the first anchor and a third fixed electrode connected to the substrate.

20. The method of claim 17, further comprising:
compensating a sense signal using sense circuitry, the sense signal representing a variation in capacitance of the at least one sense capacitor for displacement of the first anchor by combining the sense signal with a compensation signal obtained through the first lateral compensation capacitor.

* * * * *